(12) United States Patent
Straboni

(10) Patent No.: US 8,192,648 B2
(45) Date of Patent: Jun. 5, 2012

(54) METHOD FOR FORMING A SINTERED SEMICONDUCTOR MATERIAL

(75) Inventor: Alain Straboni, Buxerolles (FR)

(73) Assignee: S'Tile, Buxerolles (GF)

( * ) Notice: Subject to any disclaimer, the term of this patent is extended or adjusted under 35 U.S.C. 154(b) by 60 days.

(21) Appl. No.: 12/184,703

(22) Filed: Aug. 1, 2008

(65) Prior Publication Data

US 2009/0039319 A1 Feb. 12, 2009

Related U.S. Application Data

(63) Continuation-in-part of application No. 10/552,548, filed as application No. PCT/FR2004/050151 on Apr. 9, 2004, now Pat. No. 8,105,923.

(30) Foreign Application Priority Data

Apr. 14, 2003 (FR) ..................................... 03 04676

(51) Int. Cl.
*H01B 1/00* (2006.01)

(52) U.S. Cl. ........ 252/500; 252/194; 264/604; 264/614; 423/210; 438/471; 438/510; 438/704; 438/795; 438/796

(58) Field of Classification Search .................. 252/500, 252/194; 264/604, 614; 419/2; 438/471, 438/796, 795, 704, 510; 34/406; 423/210
See application file for complete search history.

(56) References Cited

U.S. PATENT DOCUMENTS

| | | | |
|---|---|---|---|
| 3,151,379 A | 10/1964 | Escoffery | |
| 4,281,208 A | 7/1981 | Kuwano et al. | |
| 4,390,743 A | 6/1983 | Dahlberg | |
| 4,759,887 A | 7/1988 | Geissler et al. | |
| 4,762,687 A | 8/1988 | Belouet et al. | |
| 4,849,033 A | 7/1989 | Vander Sande et al. | |
| 4,851,358 A * | 7/1989 | Huber | 438/471 |
| 4,960,721 A * | 10/1990 | Terashima et al. | 438/796 |
| 5,221,423 A * | 6/1993 | Sugino et al. | 438/704 |
| 5,378,289 A | 1/1995 | Noguchi et al. | |
| 5,385,689 A * | 1/1995 | Tom et al. | 252/194 |
| 5,431,127 A * | 7/1995 | Stevens et al. | 117/75 |
| 5,531,971 A * | 7/1996 | Tom et al. | 423/210 |
| 5,770,324 A * | 6/1998 | Holmes et al. | 428/688 |
| 6,348,428 B1 * | 2/2002 | Misu et al. | 501/95.1 |

(Continued)

FOREIGN PATENT DOCUMENTS

DE 2258305 5/1974

(Continued)

OTHER PUBLICATIONS

Santana, C.J. et al., "The Effects of Processing Conditions on the Density and Microstructure of Hot-Pressed Silicon Powder", Journal of Materials Science, vol. 31, 1996, pp. 4985-4990.

(Continued)

*Primary Examiner* — Khanh Tuan Nguyen
(74) *Attorney, Agent, or Firm* — Howard IP Law Group, PC

(57) ABSTRACT

A method of forming a material from a source material including the following steps of grinding the source material to get powders if the source material is not already in the form of powders; sintering the powders with at least one compression step and one thermal processing step; and purifying the material with a gas flow, the gas flow passing through the porosity channels of the material.

42 Claims, 6 Drawing Sheets

U.S. PATENT DOCUMENTS

| | | | |
|---|---|---|---|
| 6,494,959 | B1 | 12/2002 | Samoilov et al. |
| 6,849,242 | B1 * | 2/2005 | Koeppler et al. ............ 423/338 |
| 6,916,356 | B2 | 7/2005 | Margaria |
| 7,002,071 | B1 * | 2/2006 | Sadatomi et al. ............ 136/239 |
| 7,563,404 | B2 * | 7/2009 | Straboni ...................... 264/614 |
| 2002/0005213 | A1 * | 1/2002 | Otsuki et al. ..................... 134/26 |
| 2002/0166256 | A1 * | 11/2002 | Samoilov et al. ............... 34/406 |
| 2006/0048698 | A1 * | 3/2006 | Hall et al. ....................... 117/54 |
| 2007/0014682 | A1 | 1/2007 | Hariharan et al. |
| 2007/0023979 | A1 * | 2/2007 | Straboni ...................... 264/614 |
| 2007/0178675 | A1 * | 8/2007 | Straboni ...................... 438/493 |
| 2009/0028740 | A1 * | 1/2009 | Straboni ........................... 419/2 |
| 2009/0039319 | A1 * | 2/2009 | Straboni ...................... 252/500 |
| 2009/0068465 | A1 | 3/2009 | Chen et al. |

FOREIGN PATENT DOCUMENTS

| | | |
|---|---|---|
| DE | 19859288 A1 | 6/2000 |
| EP | 0230617 A1 | 8/1987 |
| EP | 0977274 A2 | 2/2000 |
| FR | 2038715 | 1/1971 |
| FR | 2479276 | 10/1981 |
| FR | 2666453 A1 | 3/1992 |
| FR | 2814757 A1 | 4/2002 |
| GB | 1065773 | 4/1967 |
| JP | 5314914 B | 5/1978 |
| JP | 5229812 A | 9/1993 |
| JP | 9165212 A | 6/1997 |
| JP | 11092129 A | 4/1999 |
| JP | 11323538 | 11/1999 |
| JP | 2002151713 | 5/2002 |
| JP | 2002-533289 | 10/2002 |
| JP | 2003124483 A | 4/2003 |
| WO | 9721253 A1 | 6/1997 |
| WO | 0068999 | 11/2000 |

OTHER PUBLICATIONS

Bere E., et al. "A New Technology for the Production of Silicon Sheets by Sintering of Silicon Powder Beds" 17th E.C. Photovoltaic Solar Energy Conference, Munich Germany Oct. 22-26, 2001, Proceedings of the International Photovoltaic Solar Energy Conference, Munich: WIP-Renewable Energies, DE, vol. 2 of 3 Conf. 17, Oct. 22, 2001, pp. 1799-1801.

Belogorokhov, A.I., et al., "Optical characterization of porous silicon embedded with CdSe nanoparticles", Applied Physics Letters, American Institute of Physics, New York, US, vol. 73, No. 19, Nov. 19, 1998, pp. 2766-2768.

International Search Report dated Sep. 27, 2004.

Chatterjee S. et al., "A miniature PTC thermistor based sensor element fabricated by tape casting technique", Sensors and Actuators B, Elsevier Sequoia, S.A. Lausanne, CH, vol. 60, No. 2-3, Nov. 23, 1999, pp. 155-160.

Selvan, R. K. et al., "Combustion synthesis of CuFe2O4", Materials Research Bulletin, Elsevier Science Publishing, New York, US, vol. 38, No. 1, Jan. 1, 2003, pp. 41-54.

English version of Japanese Office Action, dated Jun. 1, 2010.

French Search Report dated Jun. 29, 2010 for related French application No. FR 0958441.

* cited by examiner

METHOD FOR FORMING A SINTERED SEMICONDUCTOR MATERIAL

RELATED APPLICATIONS

This application is a continuation in part of U.S. application Ser. No. 10/552,548, filed Oct. 12, 2005 entitled Sintered Semiconductor Material which is the national stage application under 35 U.S.C. §371 of the International Application No. PCT/FR2004/050151, and claims the benefit of French Application No. 03/04676, filed Apr. 14, 2003 and Int'l. Application No. PCT/FR2004/050151, filed Apr. 9, 2004, the entire disclosures of which are incorporated herein by reference in their entireties.

FIELD OF THE INVENTION

The present invention relates to the field of semiconductors, and in particular, but not exclusively, of semiconductor materials usable to form photovoltaic cells, also called photocells.

BACKGROUND OF THE INVENTION

FIG. 1 shows a conventional photovoltaic cell 1. Photovoltaic cell 1 comprises a planar semiconductor material 3. Material 3, generally made of polysilicon, comprises three areas of different doping. A thick central area 3a is lightly P-type doped. An upper area 3b is N-type doped, and possibly overdoped at its surface. A lower area 3c is heavily P-type doped ($P^+$). A conductive comb 5 is placed above area 3b, intended to be exposed to light. An aluminum layer 6 covers the lower surface of the cell. Comb 5 and layer 6 are both intended to transmit the photovoltaic current and are connected to the + and − terminals, not shown, of the cell. An antireflection layer, not shown, is preferably placed on area 3b and comb 5 to limit the reflection of light rays at the photocell surface.

Material 3 conventionally originates from a polysilicon bar obtained from a silicon melt. The bar is sawn to obtain wafers which are then doped to obtain material 3. This manufacturing method, close to the single-crystal silicon wafer manufacturing method, is expensive and limits the possible wafer dimensions.

The inventor has disclosed in a conference in Munich (17$^{th}$ European Photovoltaic Solar Energy Conference and Exhibition, Munich, 21-26 Oct. 2001) a method of manufacturing polysilicon wafers by sintering of silicon powders. In this method, silicon powders of 5 µm or 20 µm are placed between the plates of a press. The assembly is compressed with a pressure P ranging between 70 MPa bars) and 900 MPa (9,000 bars). Then, the compacted layer is introduced into a sintering furnace, where it is heated up to a temperature T ranging between 950° C. and 1050° C. The sintering, which enables growth of bridges between the grains and stiffening of the material, has been performed at the indicated temperatures for a time range from two to eight hours, under a low argon pressure (100 Pa).

The obtained materials have sufficient mechanical strength to be able to be handled. However, their porosity is high, above 15%. Further, the grain size is small, since the size of said grains has not substantially increased during the processing. The mobility-lifetime product of the minority carriers is low, on the order of $10^{-7}$ cm$^2$V$^{-1}$ ($10^{-11}$ m$^2$V$^{-1}$ in the international system). The obtained materials are unusable in the photovoltaic field. For example, due to the high porosity, it is impossible to dope a specific area of the material, because of the dopants migrating through the porosity channels and spreading everywhere inside the material. As to the mobility-lifetime product of the minority carriers, values at least one thousand times greater are required for the material to be used in a photocell. Further, the surface of the obtained materials is uncontrolled and rough. Such a surface state prevents the provision of surface junctions, necessarily poor, in particular, because of significant leakage currents.

SUMMARY OF THE INVENTION

According to an aspect of the present invention, a semiconductor material or component is formed by sintering of semiconductor powders usable in the electronic field, especially in the photovoltaic field.

According to another aspect of the present invention, a semiconductor material is formed by sintering of semiconductor powders, which material exhibits a low roughness and/or a controlled texturation surface condition.

An aspect of the present invention provides a method of forming a semiconductor material from powders including at least one component belonging to the group formed by the elements of column IV of the Mendeleev table and their alloys. The method includes a step of compression of the powders and a thermal processing step such that part at least of the powders is melted or made viscous.

According to an embodiment of the present invention, the compression and thermal processing steps are simultaneous.

According to an embodiment of the present invention, the thermal processing is such that only powders belonging to a specific area of the material are melted or made viscous.

According to an embodiment of the present invention, the powders include silicon powders and powders of at least one other component, the thermal processing being such that the silicon is not melted and that at least one other components is melted or made viscous.

According to an embodiment of the present invention, the powders include doped semiconductor powders and undoped semiconductor powders, the thermal processing being such that only the doped powders are melted.

According to an embodiment of the present invention, the compression step is preceded by a step consisting of placing powders on a plate, the powders being different as to their nature, their granulometry, and/or their doping according to their location on the plate.

According to an embodiment of the present invention, in the compression step, the powders are pressed between plates having a surface capable of texturizing the surface of the material.

The present invention also provides a semiconductor material obtained at least partially by compression and thermal processing of powders including at least two distinct areas formed of distinct components belonging to the group formed by the elements of column IV of the Mendeleev table and the alloys thereof.

According to an embodiment of the present invention, the two distinct areas are superposed.

The present invention also provides a structure or component formed of at least one semiconductor material including grains and/or aggregates exhibiting energy gaps of different value.

BRIEF DESCRIPTION OF THE DRAWINGS

The foregoing features and advantages of the present invention will be discussed in detail in the following nonlimiting description of specific embodiments in connection with the accompanying drawings, among which.

DETAILED DESCRIPTION OF THE INVENTION

Figure 2:
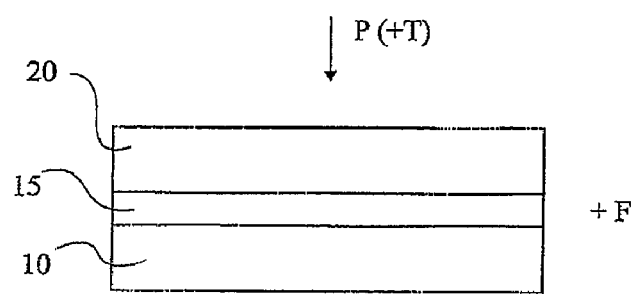
FIG. 2 illustrates an exemplary method according to an embodiment of the present invention.

FIG. 2 illustrates an exemplary method according to an embodiment of the present invention.

On a lower plate 10 is placed a bed of semiconductor powders 15, for example, silicon powders. An upper plate 20 covers powders 15. The assembly is placed in a processing enclosure and semiconductor powder layer 15 is compacted by application of a pressure P. The compaction may be performed by cold pressing, that is, at room temperature, or by hot pressing, at a temperature T, for example ranging between 950 and 1,300° C.

According to an aspect of the present invention, the sintering is performed at least partially in liquid phase, that is, before or after the compression, a thermal processing step is applied such that part at least of the powders is melted. This is symbolized by letter F in FIG. 2. In the present invention, terms "liquid phase" and "melting" must be understood in a broad sense. As will be seen hereafter, "liquid phase" may also designate a viscous phase corresponding to an overmelted liquid, term "melting" then designating the "overmelting".

The partial melting may be performed in selective fashion, for example, according to the area in the material, to the nature of the powders, or according to the used heating means.

In the areas sintered in liquid phase, the porosity is substantially zero (in practice, lower than 0.2%). Also, the melting causes an increase in the grain size, which is desirable, the resistance to the displacement of the carriers created by the grain boundaries being then decreased.

Although this is possible, it is not necessary for the entire material to be sintered in liquid phase. Indeed, in his research, the inventor has found that it is not required for the features of a material intended to form a photocell to be homogenous throughout the entire material.

For example, in a photovoltaic cell, the so-called "absorbing" portion, that is, the area intended to turn the received photons into electron-hole pairs, must have a microstructure of very high quality, that is, a porosity as close as possible to zero and the largest possible grain size. The portion forming the junction (or collection area), intended to collect the carriers, must also exhibit this type of features.

However, other areas in the material do not need a high-quality microstructure and may exhibit with no disadvantage a poor porosity. Such areas, for example, are the heavily-doped N-type or P-type conductive areas used as a contact with the N and P areas of the junction. It is enough for these areas to exhibit a sufficient conductivity, and a porosity as high as 40 or 50% can be sufficient.

Therefore, according to an aspect of the present invention, the thermal processing may be carried out to selectively cause a melting only in the areas where a high-quality microstructure is desired.

A few examples of obtained materials will be given hereafter.

A number of trials have been carried out with pressures ranging between 10 MPa and 30 MPa (100 and 300 bars). The temperatures have ranged between 950° C. and 1,350° C. The used powders have been either pure silicon powders, or silicon powders mixed with powders of other elements from column IV of the Mendeleev table, such as germanium, or silicon powders mixed with powders of non-semiconductor materials, such as silica ($SiO_2$). The granulometry of the used powders has ranged between 20 nanometers and 700 micrometers. The obtained results are spectacular.

It should be noted that, according to an aspect of the present invention, it is possible to easily control the morphology of the surface of the obtained material. Indeed, especially when the partial melting step occurs during the compression, the surface of the material faithfully reproduces the surface of plates 10 and 20. With planar and smooth plates, the surface, analyzed by electronic microscopy, appears as an even plane with a very low roughness.

It should also be noted that an advantage of performing a hot pressing of the powders, rather than a cold pressing, is that this provides a material exhibiting a low general porosity within a relatively short time, which results in time, power, and cost savings.

It should also be noted that the liquid phase into which the material passes at least partially may be of very short time, for example, shorter than one minute.

For example, in a practical example, powders of a 20-nanometer size, sintered for half an hour by hot pressing under a 120-bar (12 MPa) pressure at a 1,325° C. temperature, provide a material with a porosity close to 4%. A thermal processing by laser beam causing a surface melting of the material will enable decreasing the porosity of the surface layer of the material down to practically zero.

It should be noted that the partial melting step is not necessarily distinct from the actual sintering step. The partial melting step may be carried out simultaneously to the compression.

Examples of implementation of the method according to the present invention will now be given.

The lower and upper plates 10 and 20 are mechanical plates, sufficiently strong to enable the compression. Plates 10, 20 are compatible with the nature of the used semiconductor powders to avoid introducing impurities. For example, the plates may be made of graphite or silicon carbide.

The powders of layer 15, for example, are powders of pure silicon or silicon enriched in elements from column IV of the Mendeleev table, such as carbide, germanium, tin, or their alloys. Powders of other semiconductors may also be used, and germanium, gallium arsenide (AsGa), etc. materials may be formed by sintering.

The powders used may be of nanometric, micrometric, or even millimetric size. Preferably, the size of the powders is smaller than the thickness of the material which is desired to be obtained. However, it may also be slightly greater, because the powders are crushed during the sintering. A mixture of powders of various granulometries may also be performed to form powder bed 15, especially to, conveniently and efficiently, control the general porosity or that of areas of the obtained material.

The powders used may originate from residues of the sawing of single- or polycrystal semiconductor ingots. Very thin powders resulting from byproducts of the decomposition reactors of the silicon composites, such as silane or trichlorosilane gases, may also be used. Such powders, typically on the order of 20 nanometers, currently have no industrial use. They are very inexpensive and their use makes the methods according to the present invention even more economical.

Powder bed 15 may be formed in various manners. For example, one or several powder piles may be placed in various locations of plate 10 and the desired thickness may be equalized by means of a scraper. Powder bed 15 may also be formed by aerosol. In this case, a gas containing floating particles is sent to the processing enclosure. The particles deposit on plate 10 and form powder bed 15. Also, it is possible to use masks to place the powders at specific locations of layer 15.

It should be noted that the conditions of implementation of the method (pressure, thermal processing, powder nature and granulometry, processing time) enable controlling the features of the obtained materials and adjusting them in desired fashion.

A way to obtain the liquid phase (possibly, the viscous phase) is to use of mixture of powders such that part of the components melts (possibly, is made viscous) during the thermal processing which occurs, as it should be reminded, either during the compression step, or after.

For example, a homogenous mixture of germanium and silicon may be formed and brought to a temperature ranging between 937 and 1,410° C. The germanium melts (melting temperature 937° C.), but not the silicon (melting temperature 1410° C.). By melting, the germanium eases the transportation of silicon atoms from one silicon grain to another, as they aggregate. Further, the germanium spreads into the pores and clogs them, which results in the desired decrease in porosity. The same result may be obtained with a mixture of silicon and tin.

A sintering in liquid phase can thus be obtained by mixing powders of various materials, such as glass powders or ceramic materials, with the silicon powders. For example, the silica powders become soft and pasty from approximately 1100° C. and may also be used as a melting agent to sinter the silicon powders. It should be noted that, in this case, it is not properly speaking a liquid phase, and that this term rather designates a viscous phase, resulting from the passing of a component to the overmelted liquid state.

Generally, the liquid phase may be partially or in part evacuated during or after the sintering, for example by an anneal at high temperature, for example greater than 1,200° C. in the case of germanium. The liquid phase evacuation may also be favored by pumping at a pressure lower than the partial pressure of the considered component.

According to an aspect of the present invention, the mixture of silicon and melting agent powders needs not be homogenous. For example, in a photocell where absorbing portion and junction are on a same surface, the melted portion of the powders only needs involving the surface portion of the mixture. This can be obtained by performing a surface heating by laser beam. This may also be obtained by forming a layer 15 in two sub-layers, a lower sub-layer with silicon powders and an upper sub-layer with a mixture of powders of silicon and melting agent, germanium for example, only the melting agent melting during the sintering. The obtained material is a material including a surface area exhibiting a high-quality structure.

The liquid phase may also be obtained by selectively melting powders exhibiting a specific doping type. Thus, for example, in a mixture of doped silicon and pure silicon powders, the doped powders may selectively be melted by induction, since their conductivity is higher than that of silicon.

Of course, in the method according to an aspect of the present invention, several compression steps and/or several thermal processing steps may take place. The pressure and/or the temperature may vary along the implementation of the method according to various aspects of the present invention. For example, the pressure may be exerted for a time shorter than the thermal processing. Also, the pressure may be applied intermittently during the thermal processing. Also, the thermal processing may include several steps, only one or several of which cause the melting.

It should also be noted that a stacking of several mechanical plates imprisoning several beds of semiconductor powders may be formed, to manufacture a great number of materials at the same time.

Figure 3:
FIG. 3 shows a material according to an embodiment of the present invention.

FIG. 3 shows a material 25 obtained by the method of FIG. 2. Material 25 appears in the form of a thin wafer, of a thickness typically ranging between 100 and 1000 µm. If need be, greater thicknesses, 2000 µm, for example, or lower thicknesses, such as 50 µm, may be provided. Material 25 is mechanically strong, of adapted porosity and its surface state is optimal. The dimensions of material 25 may be quite large.

Figure 4:
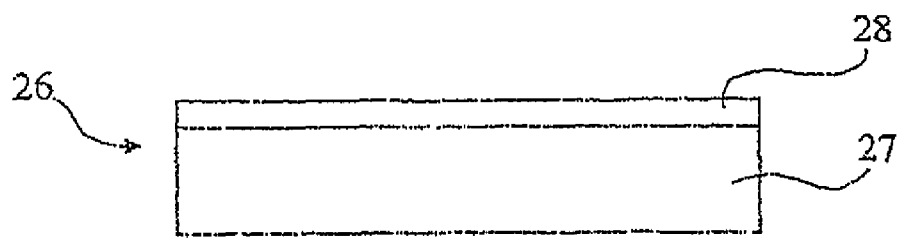
FIG. 4 shows an exemplary structure according to an embodiment of the present invention.

FIG. 4 shows a structure 26 according to an aspect of the present invention. Structure 26 comprises a mechanical support 27, such as insulating or conductive ceramic, graphite, glass, a metal, or an alloy, on which is fixed a semiconductor material 28. Structure 26 is very robust and may be obtained in several manners. For example, material 25 of FIG. 3 may first be formed and fixed in any manner, for example, by gluing, to support 27. To form support 27, one of the two plates 10 or 20 of a nature such that the semiconductor material adheres thereto during the sintering of the powders of layer 15 may also advantageously be used. Such a plate is for example formed of silicon carbide (SiC), silicon nitride ($Si_3N_4$), silica glasses enriched or not with boron, phosphorus, nitrogen, etc. Structure 26 is, thus, directly obtained by the method of FIG. 2. Structure 26 may have any thickness. Support 27 may have a rather low thickness, for example, from one to a few millimeters, or rather high, for example, from one to a few centimeters. Structure 26 may be, for example, preferred in the case of semiconductor materials 28 of small thickness, for example, 50 micrometers, or when it is desired to form semiconductor wafers of very large dimension.

Material 25 and structure 26, very inexpensive, may be used as a base to form photovoltaic cells, by application of conventional doping, metallization, etc. methods. However, the photovoltaic field is not the only possible application of material 25 or of structure 26.

For example, material 25 or material 28 of structure 26 may be used as a support for semiconductor layers deposited afterwards, which then are the active layers, materials 25 and 28 only being used as a support. This application is particularly advantageous. Indeed, materials 25 and 28 are compatible with the deposited layers, and in particular have the same expansion coefficient. In the deposition of the active layers, for example, in vapor phase, the high temperature then poses no problem of expansion difference between the deposited layers and the plate.

For example, material 25 or structure 26 may form wafers used for components for CCD cameras or flat screens, where such components may include transistors in thin layers.

A few possibilities provided by the method according to the present invention, relating to the texturation of the materials, their doping, and the forming of "composite" semiconductor materials, will now be described.

Figure 5A:
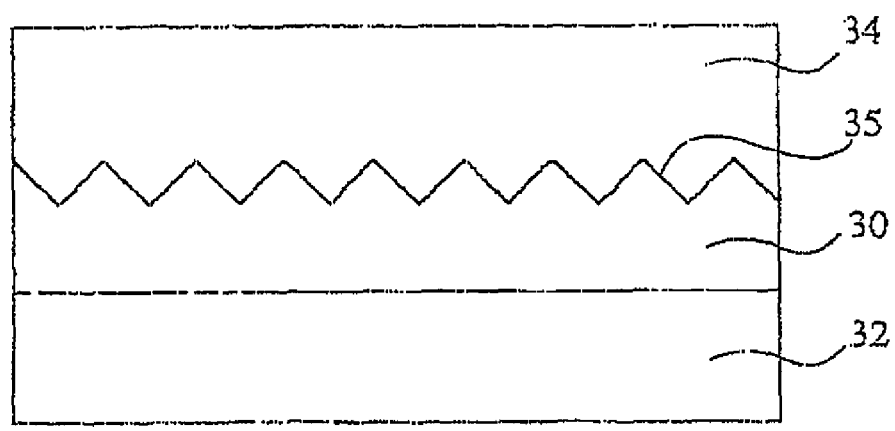
FIGS. 5a and 5b illustrate other exemplary methods according to other embodiments of the present invention.

FIG. 5a illustrates an exemplary method according to the present invention in which a layer of semiconductor powders 30 is placed between a lower plate 32 of planar surface and an upper plate 34 having its lower surface exhibiting indentations 35. Indentations 35 may have a size on the order of one fifth of the thickness of layer 30. In the compression step(s), the lower surface of plate 34 prints the pattern of indentations 35 in layer 30. The material obtained by sintering of layer 30 faithfully keeps, at its surface, the pattern transmitted by plate 34. The texture of the material surface, thus, is perfectly controlled and it may for example be adapted to a better absorption of light. It goes without saying that it is preferable to carry out, in this case, the thermal processing leading to the partial melting during the compression step, to optimally keep the pattern transferred by the plate. Of course, the partial melting may also occur after, if the pattern modification due to the melting does not adversely affect the desired features.

Figure 5B:
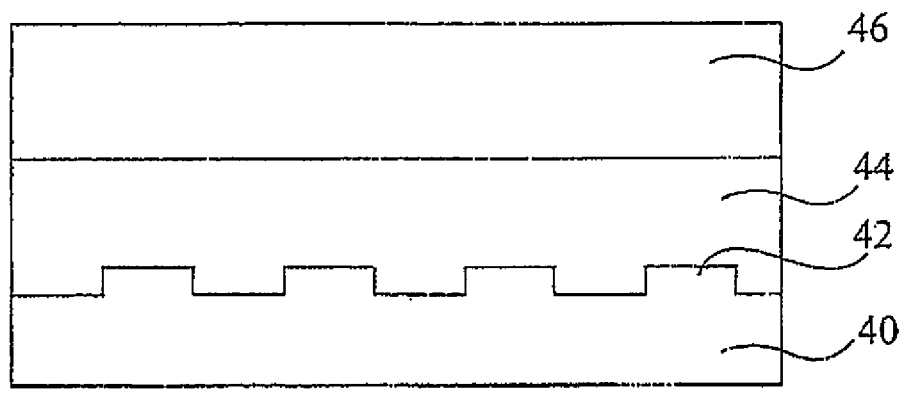

FIG. 5b illustrates another example of a texture that may be obtained at the surface of a material according to an aspect of the present invention. A lower plate 40 exhibits parallel parallelepipedal ribs 42. A bed of semiconductor powders 44 is placed on plate 40 and topped with an upper plate 46 of planar surface. After implementation of the exemplary method according to the present invention, the obtained material exhibits at its surface parallel depressions corresponding to the ribs of plate 40. As will be seen hereafter, such depressions may be filled with another material.

Various ways of doping the material according to the present invention will now be described through a few examples, in relation with FIGS. 6, 7A to 7C.

First, in the exemplary method of the present invention, it is possible to use previously-doped powders of semiconductor materials. The sintering of such powders provides a readily-doped material.

The obtained doping may be homogenous, when powders of a specific doping type, N or P, are uniformly distributed between the compression plates. Separate areas exhibiting a doping of different type and concentration may also be formed within the material by adequately distributing more or less heavily doped N- or P-type powders.

As seen, in the case of a mixture of pure silicon and doped silicon powders, the liquid phase may be obtained by only melting the doped powders. It should be noted that this further provides the advantage of decreasing down to almost zero the porosity of the doped areas. It may also be provided to only melt some of the doped areas.

A doped material may also be obtained by sintering a bed of undoped semiconductor powders to which are mixed dopants or impurities in the form of powders, such as boron, phosphorus, antimony, arsenic, gallium, aluminum, etc. It should be noted that these components melt easily and that, in melting, they optimize the microstructure of the area where they are present.

A homogenous doping of the material may also be obtained by means of undoped powders and by flowing a gas carrying dopant elements in the implementation of the method according to an aspect of the present invention. Indeed, at the beginning of the processing, the porosity of the powder bed is very high, for example, on the order of 50%. The porosity is said to be open, that is, there exists, within the powder bed or the material being formed, interconnected circulation channels emerging outside. If a dopant gas then flows, the dopant gas spreads throughout the entire material and dopes it uniformly. The partial melting step, which clogs the porosity channels, must only take place after the doping or in areas which do not involve it.

To form a PN junction, an N-type material may be formed by sintering of powders. It is locally melted, for example, at its surface. It is then doped with a P-type doping via porosities, for example, by a gas. The portions which have not melted are P-type doped, while the portions having melted, with no porosity, keep the N-type doping. A large PN junction can thus be formed.

Figure 6:
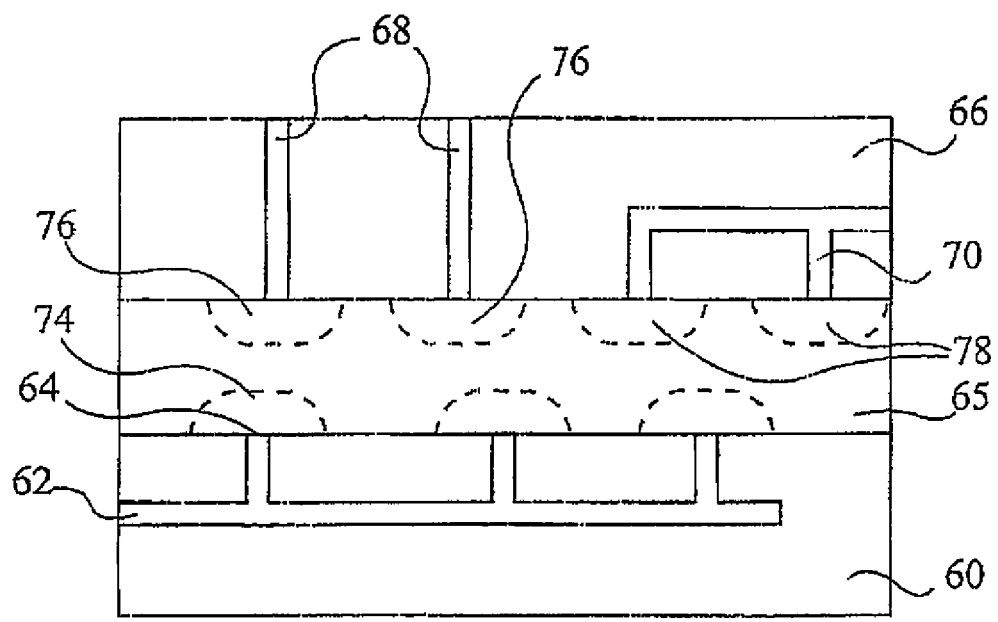
FIGS. 6, 7A to 7C illustrate ways of doping a material according to an aspect of the present invention.

FIG. 6 illustrates another way of doping the material during its forming. A lower plate 60 has a duct 62 emerging outside. Duct 62 further has openings 64 located at the upper surface of plate 60. A powder bed 65 is placed on plate 60 to form the semiconductor material. A plate 66 having ducts 68 and 70 emerging outside and at the lower surface of plate 66 is placed above. Ducts 68 each connect the outside of the plate to a specific opening of the lower surface of plate 66. Duct 70 connects the outside of plate 66 to several openings located on the lower surface of plate 66.

In the compression step, a dopant gas, for example, of type P, is sent into duct 62. This gas, due to the large number of open porosities existing at the beginning of the forming of the material, causes, in front of openings 64, the doping of areas 74 delimited in dotted lines. Depending on the gas sending conditions, the different doped areas 74 may join. The thermal processing step will have to be adapted to the desired result. Indeed, the open porosities close during the thermal processing step. Depending on the time of action of the gas in the process, it is possible to perform local dopings. Dopant gases are also sent into ducts 68 and 70 to respectively form doped areas 76 and 78. Since it is possible to separately modify the gas sending conditions into each of ducts 68 and duct 70, a size, a doping type and concentration may be obtained for each of areas 76 and 78. "Gas sending conditions" is especially used to designate the nature, the flow rate or the pressure, the action time of the gases, the time when they act, etc.

Another way of doping the material obtained according to the present invention will now be described in relation with FIGS. 7A to 7C.

Figure 7A:
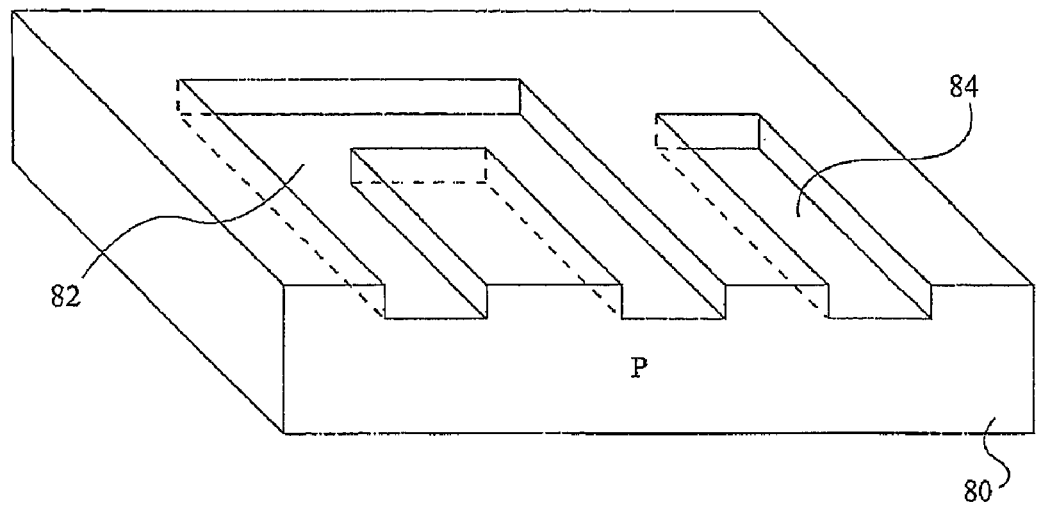

FIG. 7A schematically shows a view partially in cross-section and in perspective of a P-type material 80 obtained by sintering of powders according to an exemplary method of the present invention. Material 80 exhibits depressions 82 and 84 which have been obtained by means of a plate exhibiting protruding elements of corresponding shape, of a type similar to those of plate 40 of FIG. 5b. The width of depressions 82 and 84 may be as small as 1 μm. The edges of depressions 82 and 84 are well delimited. Depression 82 is meander-shaped and depression 84 is rectilinear. Depressions 82 and 84 are then each filled with semiconductor powders exhibiting a doping of desired type and concentration.

Figure 7B:
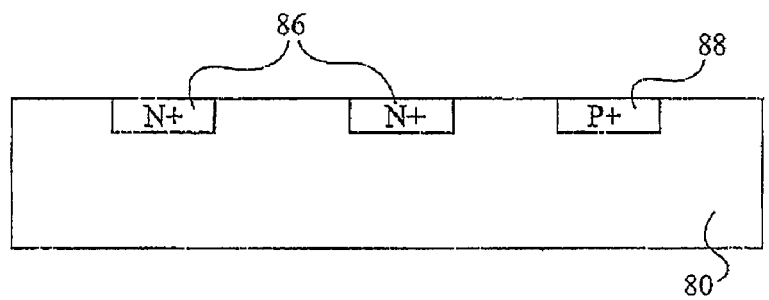

In FIG. 7B, material 80 exhibits heavily-doped N-type areas 86 ($N^+$) and a heavily-doped P-type area 88 ($P^+$). These areas have been obtained by filling depression 82 with N-type powders, and depression 84 with P-type powders, then by sintering these powders. For this purpose, the material may simply be submitted to a thermal processing step.

Figure 7C:
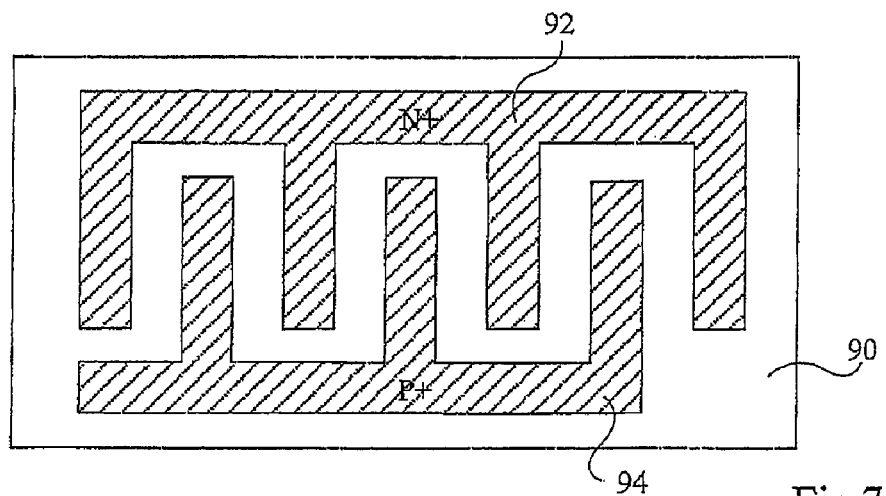

FIG. 7C shows a top view of a semiconductor material 90 according to an aspect of the present invention, in which heavily-doped N-type areas 92 and heavily-doped P-type areas 94 have been obtained according to the method described in relation with FIGS. 7A and 7B. Areas 92 and 94 are interdigited. The surface comprising areas 92 and 94 is intended to be the surface unexposed to light. This makes the forming of a collector comb such as comb 5 of FIG. 1 redundant and correspondingly increases the lit surface of the photocell.

It should be noted that the materials comprising PN junctions described hereabove are components very close to the end product embodied by a photocell. The methods according to the present invention enable further approximating the end product.

Figure 1:
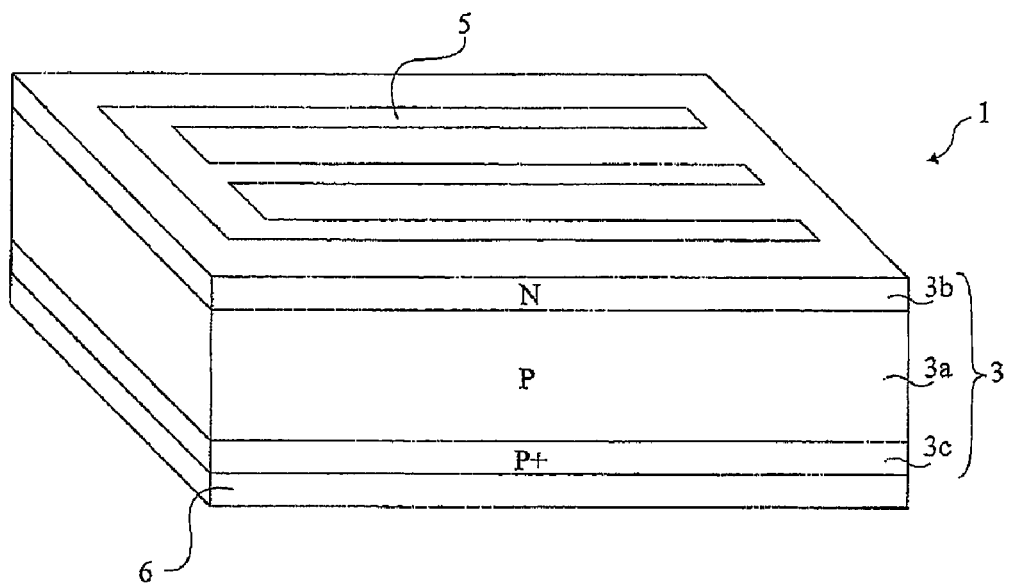
FIG. 1 shows a conventional photovoltaic cell.

On the one hand, when the PN junction is across the thickness of the material, it is possible to place a bed of aluminum powders at the base of the semiconductor powder bed in the material manufacturing. The material obtained after sintering thus includes the lower conductive layer, which no longer needs being deposited afterwards. A heavily-doped P-type area, such as area 3c of FIG. 1, is naturally produced at the contact between the P-type material and the aluminum. A thin layer of heavily-doped P-type powders, for example, from one to a few micrometers, can thus be placed on the layer of aluminum powders on manufacturing of the material. The upper collector comb may also be formed on formation of the material, by placing adequate powders, such as aluminum powders, at the appropriate locations. Transparent conductive ceramic powders may also, for the transmission of current, be placed over the entire surface of the material exposed to light.

On the other hand, when the PN junction is at the surface, as in FIG. 7C, conductive powders may be deposited on the powders intended to form the doped areas (non-lit surface of the material) before their thermal processing. The obtained material thus comprises two interdigited conductive areas, which form particularly efficient collectors of the carriers created by photoelectric effect.

A material according to an aspect of the present invention obtained by sintering of semiconductor powders of different nature will now be described. The used powders may belong to any element of column IV of the Mendeleev table, and/or to their alloys.

Figure 8:
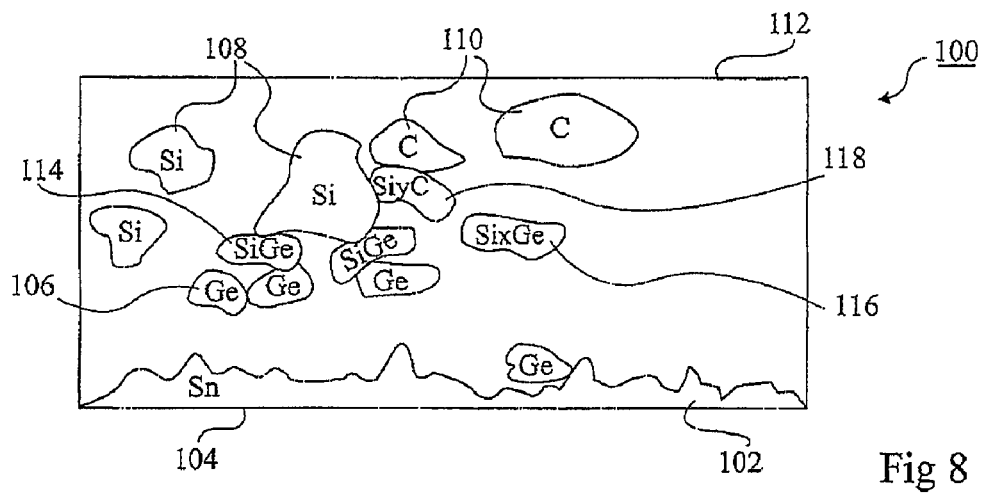
FIGS. 8, 9, and 10 show various exemplary materials according to various embodiments of the present invention.

FIG. 8 schematically shows a top view of a material 100 according to an embodiment of the present invention. Material 100 has been obtained, for example, by application of the method according to the present invention to a bed of powders including powders of tin (Sn), germanium (Ge), silicon (Si), and carbon (C). An area 102 formed of tin runs along edge 104 of material 100. Area 102 results from the sintering of tin powders placed along lateral edge 104. The uneven contour of area 102 can especially be explained by the fact that tin melts at temperatures used in the method and tends to spread into the open porosities of the material. Material 100 also comprises islets 106 of germanium (Ge), resulting from the sintering of germanium powders. Similarly, the silicon powders create silicon islets 108 and the carbon powders which, in the shown example, have been deposited rather towards edge 112 of the material, create islets of carbon C.

Further, material 100 includes islets 114 of (SiGe) alloy, islets 116 of $Si_xGe$, $Si_yC$ islets 118. The material may also include $Ge_xC$ and $Si_xGe_yC$ islets. Such alloys appear at the contact of the grains of different nature in the thermal processing, the various grains aggregating by sintering. If so desired, the forming of these alloys may be limited by placing the powders of different nature so that they avoid mixing too much. Powders of various alloys may also be arranged in the bed of powders to be sintered, to increase the proportion of the alloys. Further, the powders used or the obtained materials may be doped as described hereabove.

It should be noted that with conventional methods for manufacturing semiconductor materials, such as methods using melts, only homogenous alloys may be obtained and a "composite" material such as material 100 cannot be obtained.

Material 100 is particularly advantageous in photovoltaic applications.

Indeed, the wavelength of the radiations absorbed by a semiconductor element depends on the value of the energy gap of this element. Thus, silicon, having an energy gap of 1.1 eV, is naturally optimized for visible light. Infrared radiations are practically not absorbed by silicon. Ultraviolet radiations, are rapidly absorbed by silicon, but the excess energy represented by the difference between the energy of the radiation and the value of the energy gap is lost. Germanium, having a 0.7-eV energy gap, is particularly well adapted to absorb infrared light. An alloy of $Si_xGe$ type has an energy gap ranging between the energy gap of silicon and that of germanium. An $Si_xC$-type alloy has a much greater energy gap than that of silicon. An alloy of this type responds particularly well to blue and ultraviolet radiations.

As a result, material 100 has a locally variable energy gap. This is an extremely significant advantage, since the radiations can be used at best in a photovoltaic application. For example, material 100 may practically respond to the entire solar spectrum, which is not the case for a conventional silicon photocell.

Figure 9:
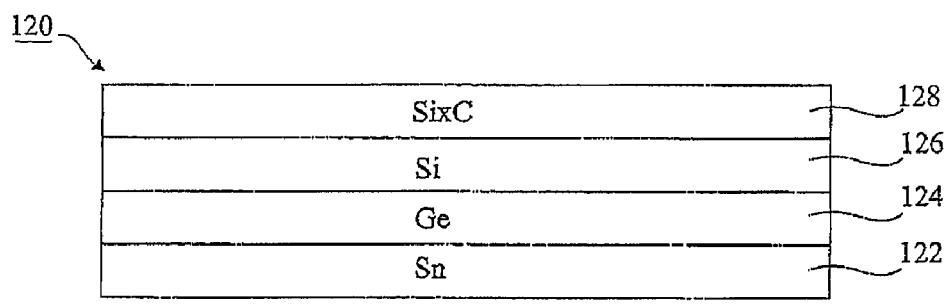

FIG. 9 schematically shows a bed of powders 120 intended for the forming of a material according to an aspect of the present invention. Powder bed 120 includes a lower layer 122 of tin powders, followed by a layer 124 of germanium powders, followed by a layer 126 of silicon powders, the assembly being topped with a layer 128 of powders of a carbon and silicon alloy $Si_xC$. The layers of powders 122, 124, 126, and 128 are arranged by increasing energy gap order.

After sintering, the obtained semiconductor material thus includes several superposed layers of materials of different energy gaps. In a photovoltaic application, the surface of the material having the layer with the larger energy gap, $Si_xC$, is exposed to light. Alloy layer $Si_xC$ absorbs the ultraviolet radiation and around and lets through visible and infrared radiations. The silicon layer absorbs the visible light and is practically transparent to infrared radiations, which are absorbed by the germanium layer. Various alloys created during the sintering help the absorption of the radiation. The tin layer, buried, is mainly used to collect the carriers created by the photovoltaic effect. As previously, a PN junction may be formed by an appropriate doping.

As compared with the material of FIG. 8, the material obtained by the powder bed of FIG. 9 is advantageous in that the radiations successively cross layers of decreasing energy gaps. This enables more complete absorption of the radiation.

Of course, the present invention is not limited to the described examples and any variation, modification, or the like within the abilities of those skilled in the art belongs to the field of the present invention.

In particular, the plates used to compress the powder bed are not necessarily planar and may have any shape.

Figure 10:
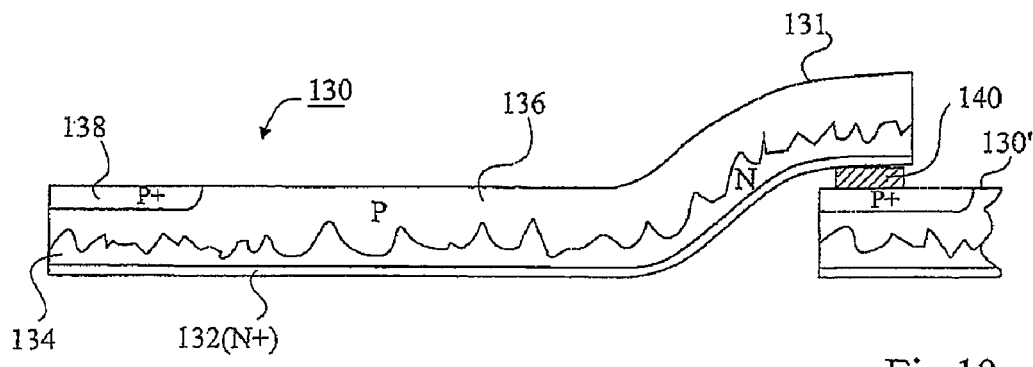

FIG. 10 thus shows a tile-shaped semiconductor material 130 that may integrate to the structure of a roof. Material 130, which will be called tile hereafter, includes a non-planar end 131 enabling covering the next tile 130' and connecting thereto. Tile 130 is obtained by sintering of a bed of semiconductor powders by means of plates of corresponding shape. The powder bed has been formed to successively create a thin heavily-doped N-type layer 132 ($N^+$), an N-type doped layer 134, followed by a P-type doped layer 136. At the end opposite to end 131 is a heavily-doped P-type area of small extension 138 ($P^+$). Tile 130 is connected to tile 130' by any conductive attachment means 140, such as a welding or a flexible wire, connecting the N⁺ layer of a tile to the P⁺ area of the next tile. The photocells formed by tiles 130 and 130' are thus series-connected. Various other ways of grouping a set of tiles, in series and/or in parallel, provide the desired features of an installation.

It should be noted that, for the melting step, any appropriate means, such as resistive furnaces, lamp furnaces, solar furnaces, etc. may be used, the power being transferred by conduction, convection, radiation, etc.

It should also be noted that any structure or component including or formed of one or several materials according to the present invention belongs to the field of the present invention.

It should also be noted that the materials according to the present invention are not limited to the materials obtained by the methods according to the present invention. For example, any semiconductor material including grains and/or aggregates exhibiting different energy gaps belongs to the field of the present invention, whatever its obtaining mode.

Some further embodiments or aspects of the present invention will now be described in relation to FIGS. 11 and 12.

According to the following aspect of the present invention, the materials or wafers produced by the method of the present invention can be purified during their production steps. This aspect of the present invention is particularly useful if the powders used to form the sintered material are not very pure.

The inventor has found that it was possible to purify a porous semiconductor material using a gas flow through the material. At least two factors explain the good results in purification. First, the gas flows through the porosity channels of the material, and reaches great parts of the inner volume of the material. Second, due to diffusion, impurities inside the material reach the porosity channels and can be evacuated out of the material by the gas flow. As this will be seen later, the gas which is used for the purification can be a non-reactive gas, or a gas which reacts with impurities of the material. In the latter case, impurities can form, with the gas or other atoms or molecules present or formed in the material, volatile components which are carried out of the material by the gas flow. The purification of the material can be performed during the production of the material, that is, during the sintering of the powders, or after the production of the material. The materials purified according to the present invention can be used in the photovoltaic, electronic, or microelectronic field.

The purification of the material allows the use of powders which are not very pure. For example, the powders can derive from parts of single-crystal or polycrystalline silicon ingots which are not sufficiently pure, like head, tail and edges of the ingots. The source material can also be damaged wafers or wafers with defects, at any stage of the fabrication of photovoltaic cells, electronic components or integrated circuits. If the source material is already doped, the purification according to the present invention allows also the production of purified material. Silicon used in metallurgy can also be used in the present invention. For example, silicon including one or some percent of iron can be purified by the present invention.

The source material can, of course, include all or several of the elements mentioned above. If the source material is not already present in the form of powders, the methods of the present invention provide a grinding step for providing powders from the source material. The powders can be of various sizes, but a size less than 10 micrometers can be preferred.

The production of purified wafers according to the present invention will now be described in relation with FIGS. 11 and 12.

Figure 11:
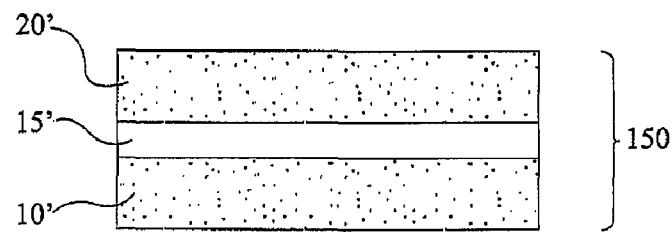
FIG. 11 shows an exemplary assembly used by an exemplary method of the present invention.

FIG. 11 shows, in cross-section, an assembly 150 including a lower plate 10', a bed of semiconductor powders 15', for example silicon powders, and an upper plate 20' which covers powders 15'. The assembly 150 is similar to the assembly shown in FIG. 2, except that lower plate 10' and upper plate 20' are made of a porous material, for example a porous ceramic or graphite, allowing the passage of a gas.

The powders of layer 15', like the powders 15 of FIG. 2, for example are powders of pure silicon or silicon enriched in elements from column IV of the Mendeleev table, such as carbon, germanium, tin, or their alloys. Powders of other semiconductors may also be used, and germanium, gallium arsenide AsGa, etc. materials may be formed by sintering.

The powders used may be of nanometric, micrometric, or even millimetric size. Preferably, the size of the powders is smaller than the thickness of the material which is desired to be obtained. However, it may also be slightly greater, because the powders are crushed during the sintering. A mixture of powders of various granulometries may also be performed to form powder bed 15', especially to conveniently and efficiently control the general porosity or that of areas of the obtained material. Powder bed 15' may be formed like powder bed 15 of FIG. 2.

Figure 12:
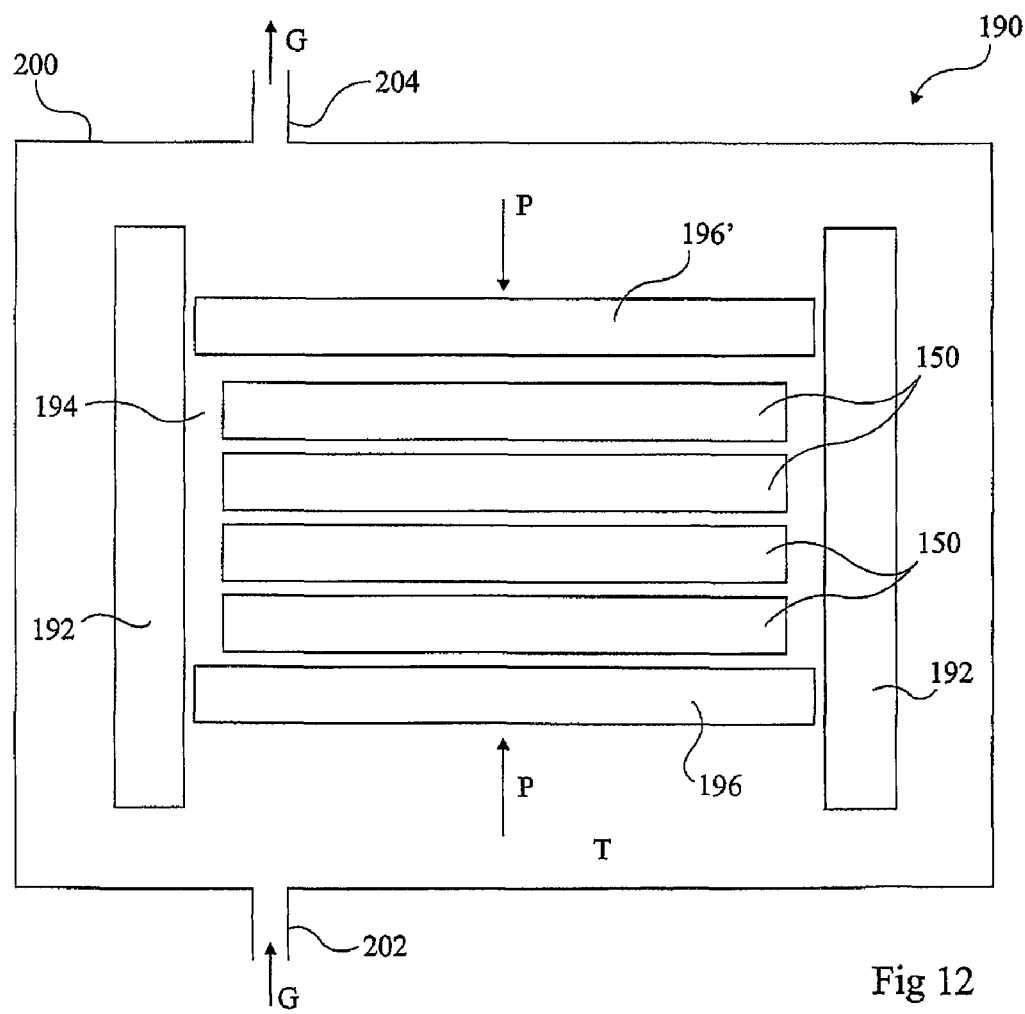
FIG. 12 shows a device used for producing materials according to an embodiment of the present invention.

FIG. 12 shows a reactor 190 allowing the production and the purification of wafers according to the present invention.

In FIG. 12, reactor 190 includes a matrix 192 forming a chamber 194. A lower plate 196 and an upper plate 196' close chamber 194. Plates 196 and 196' are made of a porous material. Matrix 192 can be also made of a porous material, but it is not necessary. Matrix 192 and plates 196, 196' are disposed in an enclosure 200 having at least an input opening 202 for inputting a gas G and a gas output opening 204.

Several assemblies like assembly 150 of FIG. 11 are arranged in chamber 194, so as to produce a lot of wafers simultaneously.

To produce the wafer, a pressure P is exerted on or between the plates 196 and 196'. Pressure P ensures a compacting of the silicon powders 15', the plates 10' and 20' compressing the powders.

Reactor chamber 194 is then submitted to a thermal processing at a temperature T, in order to provide a sintering of the wafers. The thermal processing can be applied, as already explained, during or after the compacting of the powders. The pressure exerted in the compression step may vary within a wide range of values, for example, from 10 bars (1 megapascals) to 10,000 bars (1 gigapascal). The temperature used in the thermal processing may also vary within a wide range of values. For example, the temperature may be between 800 and 1400° C. for silicon.

As already mentioned, the purification step can be performed during one of the formation steps of the material. Of course, the purification steps take place before the liquid phase occurs if a liquid phase is needed. If this was not the case, the liquid phase would close a lot of porosity channels, and the gas would be unable to flow through the material for purifying it.

Some of the possible operating modes will now be described.

For example, it is possible to perform a hot pressing step of the powders while purification due to gas flow takes place.

Also, a hot pressing step can be performed in order to form the material. Then, the purification step can take place, in the same enclosure as the enclosure used for the hot pressing step, or in a separate enclosure.

Also, a cold pressing step can be first performed. Then, the thermal processing and the purification step can be performed together, or separately.

In all the cases, when needed, the steps producing a liquid phase in the material take place after purification.

Characteristics of the purification step or steps will now be described.

Gas enters enclosure 200 via opening 202. Then, the gas enters chamber 194 through porous plates 196, 196', and matrix 192 if matrix 192 is porous. The gas passes then through the assemblies 150 of chamber 194, via plate 10', the porosity channels of the material which is being formed, and plate 20'.

Instead of being made of porous material, one or more elements among plates 196, 196', matrix 192, plate 10', and plate 20' can be made of a non porous material pierced with small traversing openings allowing the gas to pass. For example, these opening can be small conduits or ducts with a diameter of 0.1 to 1 millimeter.

The purification step, using a gas flow, can be performed at various times of the formation of the wafers. For example, it can be performed at the first stages of powder compaction. It can be performed also at one of the last stages of the sintering of the material. It is just necessary that the porosity of the material remains an open porosity, that is that the porosity channels within the material are interconnected and lead to the outside the material.

The material is more rapidly purified if the temperature is high, because impurities have a better mobility and can reach more easily the porosity channels. For example, the temperature may be between 800° C. and the melting temperature of the material. It is advantageous to purify the material during the or one of the thermal processing steps of the sintering process.

Various durations can be used for the purification step. For example, the duration of the purification step will be of about half an hour to one hour after chamber 194 has reached the desired temperature, the duration of which can also be in the order of about half an hour to one hour. The duration of the purification process depends on various factors. For example, if powders have a small size, the porosity channels are close one to the other and impurities reach quickly the porosity channels, whereby the material is purified faster.

Various gas pressures can be used, and the gas pressure can change during the purification step.

If the gas pressure is more than one atmosphere, a gas flow occurs naturally between opening 202 and opening 204.

If the gas pressure is less than one atmosphere, the pressure in chamber 194 is a low pressure, for example ranging from 1 to 10 hectopascals. In this case, the gas is pumped at opening 204, for creating the gas flow and evacuating the gas at the outside.

Various sorts of gas can be used.

For example, the gas can be a non-reactive gas, like argon. When a non-reactive gas flows through the porosity channels of the material, impurities which are not or only little linked to the walls of the porosity channels can be detached and carried out of the material by the gas flow. Further, due to diffusion, impurities inside the material but not present in a porosity channel can reach a porosity channel and be evacuated.

Preferably, the gas is at least partly a reactive gas which chemically reacts with a particular type of impurities to provide volatile components at the used temperatures. These volatile components are evacuated outside the material by the gas flow. The gas can also be a mixture of a carrier gas, like argon, and at least one reactive gas.

The type of the reactive gas depends on the type of impurities to be eliminated.

Examples of very polluting impurities of silicon, which are very difficult to eliminate at low cost, are the metallic impurities. These metallic impurities comprise titanium (Ti), tungsten (W), molybdenum (Mo), iron (Fe), chromium (Cr) or copper (Cu). The inventor has found that a flow of a gas containing chlorine, like chlorine ($Cl_2$) or hydrochloric gas (HCl), in the porosity channels of the material, reacts with the atoms of titanium present in the material to form a volatile component, titanium tetrachloride ($TiCl_4$), carried away and evacuated by the gas flow. Atoms of titanium not present in or at the surface of porosity channels can reach a porosity channel due to diffusion, and are then likely to react with the gas. As a result, the purification process of the present invention provides a material without titanium, as all the inner volume of the material can be reached by the porosity channels. A gas containing chlorine can eliminate other impurities than titanium, as the majority of metals, like iron or copper, also reacts with chlorine. A gas containing fluorine like tetrafluoromethane ($CF_4$), sulphur hexafluoride ($SF_6$), or dichlorodifluoromethane ($CCl_2F_2$), or containing bromine like hydrogen bromide (HBr) can also be used. To eliminate tungsten, a gas containing fluorine will be used, as tungsten forms with fluorine a volatile component, tungsten hexafluoride ($WF_6$), carried out of the material by the gas flow. Molybdenum reacts with tetrafluoromethane ($CF_4$) to form a volatile component, molybdenum fluoride ($MoF_6$), which can be evacuated.

Another kind of impurities includes non metallic impurities like oxygen and carbon. Oxygen is mostly present as the oxides which are naturally present at the surface of the powder particles. A gas containing hydrogen reduces the oxides, which are then evacuated outside the material. The gas which is used can be the hydrogen gas ($H_2$), or a gas containing hydrogen, like the hydrochloric gas (HCl) or the ammoniac gas ($NH_3$). Carbon is also evacuated by gases containing hydrogen because carbon provides volatile hydrocarbons, like methane ($CH_4$), depending on the conditions in chamber 94, for example a temperature of about 1000° C. with a mixture of gases containing argon and about 10% of hydrogen ($H_2$).

Regarding alkaline-earth impurities, like sodium, calcium, magnesium or manganese, the inventor has noticed that, at the used temperatures, these impurities are greatly evacuated using a mere pumping, without injecting a gas. The injection of a non-reactive gas helps in eliminating these impurities. Further, if a gas containing chlorine is used for eliminating other impurities, chlorine also eliminates alkaline-earth impurities, like sodium and calcium.

Doping elements can be also suppressed by the methods of the present invention. Indeed, phosphorus, boron, arsenide, gallium, aluminum can provide volatile complexes with hydrogen, chlorine and/or carbon. For example, an atom of boron can be combined with an atom of hydrogen and a silicon oxide (SiO) particle to form an atom of silicon and a molecule of HBO or boric acid ($H_3BO_3$), which can be evacuated. Boron can also be evacuated using water-vapor. Some doping elements can also be evacuated by the gas flow merely when temperature is high.

It should be noted that the gas which is used can be a mixture of gases, if the gases are compatible at the temperatures used. For example, it is possible to use a gas mixture comprising 95% of argon (Ar), 4% of hydrogen ($H_2$) and 1% of chlorine ($Cl_2$). If incompatible gases are to be used, they will be used the one after the other.

It should also be noted that the present invention allows a selective cleaning of impurities, depending on the conditions and on the nature of the gas. Thus, silicon powder with for example 10 ppm of boron and 10 ppm of phosphorus can be purified from one of the doping elements to become a doped material of the N or P type. The inventor has noticed that phosphorus is easily eliminated at temperatures above 1200° C. due to its vaporization. To eliminate boron, a part of water-vapor in argon at a temperature ranging between about 700 to 900° C. can be used to produce the volatile molecule HBO or boric acid ($H_3BO_3$).

Further, pumping can be advantageous. Indeed, a component to be eliminated may have a saturating vapor pressure and be in equilibrium with its vapor in a porosity channel of the material. Continuously pumping in this case decreases the vapor pressure and the component to be eliminated produces more vapor, which may accelerate the speed of the process for eliminating this component.

Of course, as already mentioned, the present invention is likely to have various alterations and modifications which will occur to those skilled in the art.

In particular, it should be noted that every step of the purification and/or formation of the material can be split into a plurality of steps.

Also, the methods of the present invention may provide other materials than semiconductor materials, and the purification steps of the present invention may be applied to any porous material.

Also, when the present invention is applied to elaborating materials for the photovoltaic, electronic or microelectronic field, the powders which are used are not necessarily powders of a unique semiconductor. For example, the powders may be powders of silicon mixed with powders of any other element of column IV of the Mendeleev table, like Germanium (Ge). The powders may also be semiconductor powders mixed to powders of non semiconductor materials, like silica ($SiO_2$).

The invention claimed is:

1. A method for forming a material from a source material comprising the steps of:
    a) grinding the source material to get powders in the event the source material is not already in the form of powders;
    b) sintering the powders with at least one compression step and one thermal processing step; and
    c) purifying the material with a gas flow, the gas flow passing through the porosity channels of the material,
    wherein the thermal processing is such that only powders belonging to a specific area of the material are melted or made viscous.

2. The method of claim 1, wherein the gas is a non-reactive gas.

3. The method of claim 1, wherein the gas comprises at least one reactive gas which reacts with the impurities of the material in order to form volatile components which are carried out of the material by the gas flow.

4. The method of claim 3, wherein the gas comprises hydrogen or an element of the halogen family.

5. The method of claim 1, wherein the gas is a mixture of a non-reactive carrier gas and at least one reactive gas.

6. The method of claim 1, wherein the gas flow is produced by pumping, the gas pressure being the atmospheric pressure or a pressure being between 1 hectopascal and the atmospheric pressure.

7. The method of claim 1, wherein the gas has a pressure greater than one atmosphere.

8. The method of claim 1, wherein the purification step is simultaneous with at least one of compression step and one thermal processing step.

9. The method of claim 1, wherein the sintering step comprises a hot pressing step.

10. The method of claim 1, wherein the sintering step comprises at least one cold compression step followed with at least one thermal processing step.

11. The method of claim 1, wherein the material is a semiconductor material which can be used in the photovoltaic, electronic and/or microelectronic fields.

12. The method of claim 11, wherein the material is a wafer.

13. The method of claim 12, wherein the wafer has a thickness comprised between 100 and 300 micrometers.

14. The method of claim 1, wherein the powders used in the sintering step are powders comprising at least one component belonging to the group formed by the elements of column IV of the Mendeleev table and their alloys.

15. A method for forming a material from a source material comprising the steps of:
    a) grinding the source material to get powders in the event the source material is not already in the form of powders;
    b) sintering the powders with at least one compression step and one thermal processing step; and
    c) purifying the material with a gas flow, the gas flow passing through the porosity channels of the material,
    wherein the powders comprise silicon powders and powders of at least one other component, the thermal processing being such that the silicon is not melted and that at least one of the other components is melted or made viscous.

16. The method of claim 15, wherein the gas is a non-reactive gas.

17. The method of claim 15, wherein the gas comprises at least one reactive gas which reacts with the impurities of the material in order to form volatile components which are carried out of the material by the gas flow.

18. The method of claim 17, wherein the gas comprises hydrogen or an element of the halogen family.

19. The method of claim 15, wherein the gas is a mixture of a non-reactive carrier gas and at least one reactive gas.

20. The method of claim 15, wherein the gas flow is produced by pumping, the gas pressure being the atmospheric pressure or a pressure being between 1 hectopascal and the atmospheric pressure.

21. The method of claim 15, wherein the gas has a pressure greater than one atmosphere.

22. The method of claim 15, wherein the purification step is simultaneous with at least one of compression step and one thermal processing step.

23. The method of claim 15, wherein the sintering step comprises a hot pressing step.

24. The method of claim 15, wherein the sintering step comprises at least one cold compression step followed with at least one thermal processing step.

25. The method of claim 15, wherein the material is a semiconductor material which can be used in the photovoltaic, electronic and/or microelectronic fields.

26. The method of claim 25, wherein the material is a wafer.

27. The method of claim 26, wherein the wafer has a thickness comprised between 100 and 300 micrometers.

28. The method of claim 15, wherein the powders used in the sintering step are powders comprising at least one component belonging to the group formed by the elements of column IV of the Mendeleev table and their alloys.

29. A method for forming a material from a source material comprising the steps of:
    a) grinding the source material to get powders in the event the source material is not already in the form of powders;
    b) sintering the powders with at least one compression step and one thermal processing step; and c) purifying the material with a gas flow, the gas flow passing through the porosity channels of the material, wherein the powders comprise doped semiconductor powders and non doped semiconductor powders, the thermal processing being such that only the doped powders are melted.

30. The method of claim 29, wherein the gas is a non-reactive gas.

31. The method of claim 29, wherein the gas comprises at least one reactive gas which reacts with the impurities of the material in order to form volatile components which are carried out of the material by the gas flow.

32. The method of claim 31, wherein the gas comprises hydrogen or an element of the halogen family.

33. The method of claim 29, wherein the gas is a mixture of a non-reactive carrier gas and at least one reactive gas.

34. The method of claim 29, wherein the gas flow is produced by pumping, the gas pressure being the atmospheric pressure or a pressure being between 1 hectopascal and the atmospheric pressure.

35. The method of claim 29, wherein the gas has a pressure greater than one atmosphere.

36. The method of claim 29, wherein the purification step is simultaneous with at least one of compression step and one thermal processing step.

37. The method of claim 29, wherein the sintering step comprises a hot pressing step.

38. The method of claim 29, wherein the sintering step comprises at least one cold compression step followed with at least one thermal processing step.

39. The method of claim 29, wherein the material is a semiconductor material which can be used in the photovoltaic, electronic and/or microelectronic fields.

40. The method of claim 39, wherein the material is a wafer.

41. The method of claim 40, wherein the wafer has a thickness comprised between 100 and 300 micrometers.

42. The method of claim 29, wherein the powders used in the sintering step are powders comprising at least one component belonging to the group formed by the elements of column IV of the Mendeleev table and their alloys.

* * * * *